United States Patent [19]

Ehlers et al.

[11] Patent Number: 5,588,202
[45] Date of Patent: Dec. 31, 1996

[54] METHOD FOR MANUFACTURING AN OVERMOLDED SENSOR

[75] Inventors: Wayne L. Ehlers, Lanark; Kenneth L. Eichholz, Jr.; Mark F. Johnston, both of Freeport, all of Ill.

[73] Assignee: Honeywell Inc., Minneapolis, Minn.

[21] Appl. No.: 406,079

[22] Filed: Mar. 17, 1995

[51] Int. Cl.⁶ ........................................ H01F 7/06
[52] U.S. Cl. .................. 29/606; 29/593; 29/841; 29/856; 361/760; 174/52.2
[58] Field of Search .............. 29/606, 593, 841, 29/855, 856, 858; 361/760; 174/52.2

[56] References Cited

U.S. PATENT DOCUMENTS

| | | | |
|---|---|---|---|
| 3,409,856 | 11/1968 | Meoni | 29/855 |
| 3,714,709 | 2/1973 | Liederbach | 29/841 |
| 3,996,510 | 12/1976 | Guichard | 324/236 |
| 4,134,091 | 1/1979 | Rogers | 29/606 X |
| 5,121,289 | 6/1992 | Gagliandi | 361/679 |
| 5,349,500 | 9/1994 | Casson et al. | 361/749 |
| 5,364,707 | 11/1994 | Swinhen | 428/612 |

FOREIGN PATENT DOCUMENTS

3-278505  12/1991  Japan ......................... 29/855

Primary Examiner—Peter Vo
Assistant Examiner—Khan Nguyen
Attorney, Agent, or Firm—William D. Lanyi

[57] ABSTRACT

A method is described for manufacturing a plurality of proximity sensors which are attached to a printed circuit board during the manufacturing steps and subsequently severed from the printed circuit board by shearing. Each of the proximity sensors comprises a core and coil assembly, a plurality of electronic components and an electrical connector. These components of each of the proximity sensors is encapsulated during an overmolding process and the encapsulations are removed from the printed circuit board by a shearing step. Each of the encapsulations can be inserted into a cylindrical housing.

17 Claims, 10 Drawing Sheets

METHOD FOR MANUFACTURING AN OVERMOLDED SENSOR

BACKGROUND OF THE INVENTION

1. Field of the Invention

The present invention is generally related to a sensor and, more particularly, to a method for manufacturing a proximity sensor that is efficient and results in a proximity sensor which is able to withstand rigorous use.

2. Description of the Prior Art

Many different types of sensors are known to those skilled in the art. One particular type of sensor is a proximity sensor that utilizes a core and coil assembly associated with an electronic circuit for the purpose of detecting the presence or absence of an electrically conductive object within its detection zone. Proximity sensors that are designed to respond to all types of metals within their detection zone are typically radio frequency inductive devices that are operated on the Eddy Current Killed Oscillator (ECKO) principle. The oscillator consists of an LC tank circuit and an amplifier circuit which has positive feedback. The oscillator frequency is determined by the inductance and capacitance of the LC network. The inductance portion of the tuned circuit is formed by the sensor coil and a ferrite core. The oscillator circuit has just enough positive feedback to keep it oscillating. This oscillation generates an AC waveform which varies in amplitude depending on whether or not a conductive target is present within the detection zone.

Known manufacturing techniques for making a proximity sensor typically mount a plurality of electronic components on a preformed printed circuit board and then attach a core and coil assembly to one end of the printed circuit board and a connector assembly to the opposite end of the printed circuit board. This assembled structure is then inserted into a tubular housing. The remaining spaces within the tubular housing that surround the components of the assembled structure are filled with a curable epoxy. The epoxy is typically heat curable. When the epoxy hardens, the proximity sensor comprises a tubular housing filled with a solid mass of epoxy which surrounds the printed circuit board, the core, the coil, the connector and the electronic components attached to the printed circuit board.

The epoxy used in the manufacturing method described above serves the purpose of preventing the electronic components of the proximity sensor from being damaged by impact forces imposed on the sensor. In addition, the epoxy provides protective sealing in harsh environments, provides thermal dissipation from the electronic components of the proximity sensor and isolates the electronic circuitry within the sensor.

The process described above increases the cost of the proximity sensor by requiring the steps of injecting the liquid epoxy into the housing, assuring that the epoxy fills the entire region within the housing surrounding the components of the sensor and then waiting the required time until the epoxy is completely cured so that the individual sensors can be packaged for shipment. The curing process for a typical epoxy, such as amine cured resins, usually takes about four to eight hours at an elevated temperature for complete curing to take place.

U.S. Pat. No. 5,121,289, which issued to Gagliardi on Jun. 9, 1992, discloses an encapsulatable sensor assembly that includes an external housing with internal support components for retaining an active sensor element and associated electrical circuit in a predetermined relationship while providing a plurality of internal sequentially interconnected cavities for facilitating a flow of an encapsulating material from an encapsulating material injection port to a vented overflow to assure a complete fill of the internal cavities to restrain the internal components. The sensor assembly provides a structure for a void free encapsulation and internal lead wire stress relief concurrently with location control of the internal components while also providing a combination which is easily adaptable to automatic assembly and encapsulation techniques.

Some proximity sensor use individual rigid printed circuit boards to support the electronic components, the core, the coil and the connector. Other types of magnetically sensitive devices have used flexible circuits for these purposes. Rather than using a rigid printed circuit board, these devices incorporate a flexible material that provides the electrically conductive connections and can be used to support a plurality of electronic components thereon.

U.S. Pat. No. 5,349,500, which issued to Casson et al on Sep. 20, 1994, discloses a direct application of an integrated circuit to a flexible printed circuit. The apparatus can be used for electrically connecting flip chips to a flexible printed circuit substrate. A method comprises providing solder paste to a plurality of active contact pads located on the flexible printed circuit substrate and then placing the flip chips on the substrate such that solder bumps located on the flip chips are in registration with the solder paste on the active contact pads. Thirdly, the method includes the step of heating the resulting assembly as a whole so that the solder past on each active contact pad flows to form an electrical connection with its corresponding solder bump.

U.S. Pat. No. 5,364,707, which issued to Swisher on Nov. 15, 1994, describes a metal film laminate resistant to delamination. The invention can comprise a layered film structure having a metal layer securely bonded to a film layer. The laminate contains a unique metal oxide attachment structure between the film and metal layer comprising randomly distributed regions of metal oxide. The peel strength of such a laminate is significantly improved over prior laminates and is resistance to peel strength reduction due to environmental stress. The preferred metal film laminates made with polyester or polyamide can be used in the manufacture of high quality, low costs, flexible printed circuit boards.

The manufacturing costs of proximity sensors made in accordance with known methods can be excessive because of the manual assembly steps that are typically required and, in addition, as a result of the difficult and time consuming use of liquid epoxy which must be inserted into each housing individually and then allowed to cure over a relatively long period of time. It would therefore be significantly beneficial if a means were provided to manufacture proximity sensors in a more efficient way that did not require the individual insertion of liquid epoxy into individual housings of the proximity sensors and the time consuming curing cycle to allow the liquid epoxy to properly cure.

SUMMARY OF THE INVENTION

The present invention relates to a method for manufacturing a proximity sensor that comprises the step of providing a printed circuit board having a first side and a second side and then perforating the printed circuit board to form a plurality of substrate sections connected together by a plurality of ribs, wherein each of the plurality of substrate sections has a plurality of electrically conductive paths formed thereon. The method further comprises the step of attaching a first plurality of electronic components to the first side of each of the plurality of substrate sections, wherein each of the first plurality of electronic components is connected in electrical communication with at least one of the first plurality of electrically conductive paths of a preselected one of the plurality of substrate sections to form a first at least one electrical circuit on each of the plurality of substrate sections. The method further comprises the step of attaching an electrical coil to a first end of each of the plurality of substrate sections and attaching an electrical connector to a second end of each of the plurality of substrates sections. The present invention further comprises a step of calibrating each of the first electrical circuits and then simultaneously forming a plurality of encapsulations, wherein each of the plurality of encapsulations is disposed around one of the plurality of substrate sections and its associated electronic components, coil and connector. The preferred embodiment of the present invention further comprises the step of severing the ribs to detach each of the plurality of encapsulations from the printed circuit board.

In certain embodiments of the present invention, it further comprises the step of attaching a second plurality of electronic components to the second side of each of the plurality of substrate sections, wherein each of the second plurality of electronic components is connected in electrical communication with at least one of a second plurality of electrically conductive paths on the second side of a preselected one of the plurality of substrate sections to form a second electrical circuit on each of the plurality of substrate sections.

In certain embodiments of the present invention, the manufacturing method can further comprise the step of shearing the first end of each of the plurality of substrate sections in order to accommodate a preselected size of coil. Typically, the coils used in conjunction with the present invention are wound around an associated core structure. Certain embodiments of the present invention further comprise the step of shearing the second end of each of the plurality of substrate sections to select an effective length of the proximity sensor. As an additional step, certain embodiments of the present invention further comprise the step of inserting each of the plurality of encapsulations into an associated tubular housing following the step of shearing the encapsulations from the ribs. The tubular housing can be made of plastic or metal, such as nickel plated brass or stainless steel, and the step of inserting the encapsulations into the tubular housing can further comprise the step of placing an O-ring around each of the plurality of encapsulations prior to performing the inserting step.

Although not limiting to the present invention, a particularly preferred embodiment uses thermoset material as the encapsulant.

BRIEF DESCRIPTION OF THE DRAWINGS

The present invention will be more fully and completely understood from a reading of the Description of the Preferred Embodiment in conjunction with the drawings, in which.

DESCRIPTION OF THE PREFERRED EMBODIMENT

Throughout the Description of the Preferred Embodiment, like components will be identified by like reference numerals.

Figure 1:
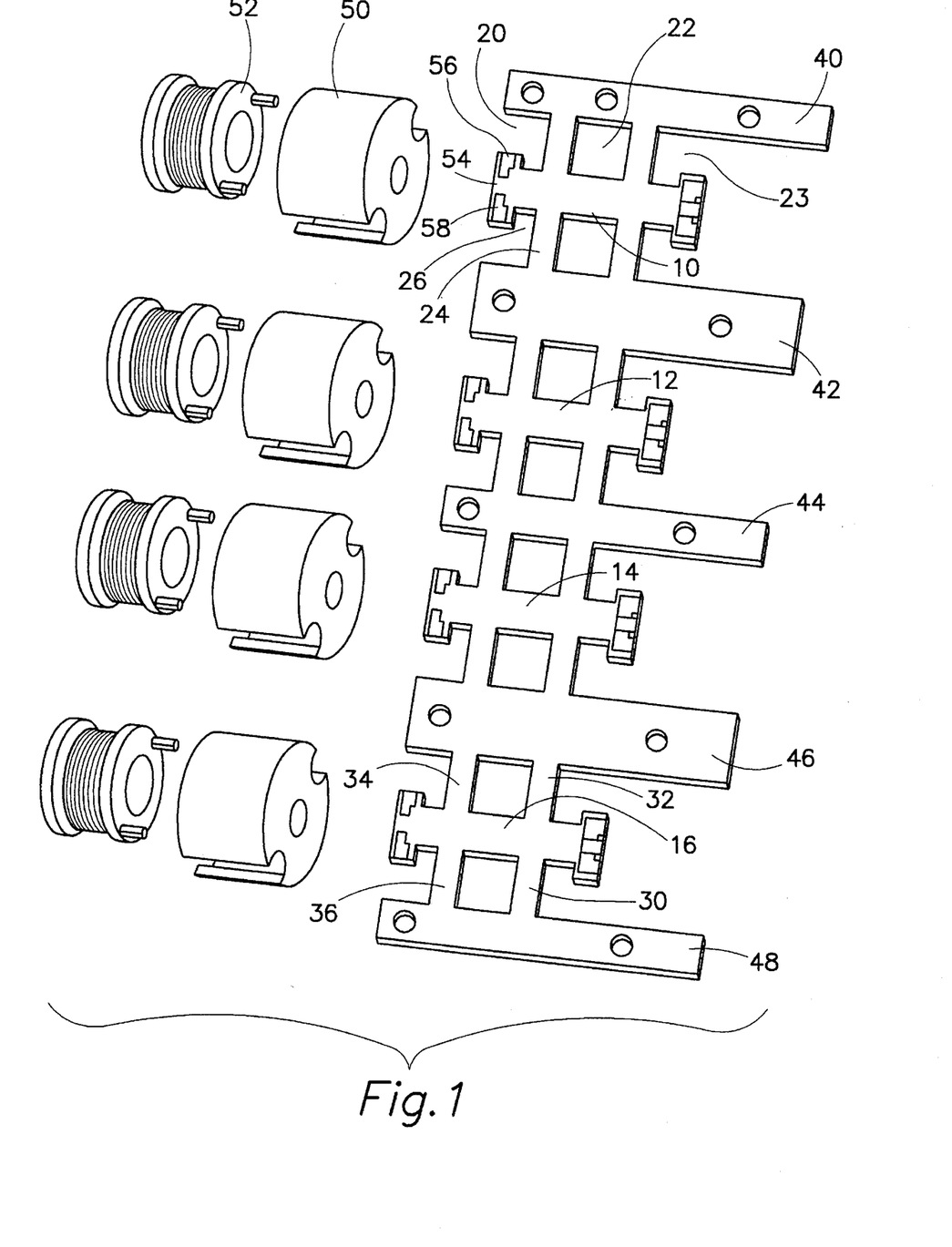
FIG. 1 shows an exploded view of a perforated printed circuit board, a coil assembly and a core.

FIG. 1 illustrates an exploded view which shows a printed circuit board that has been perforated to define a plurality of substrate sections, 10, 12, 14 and 16, which are formed by perforating the printed circuit board at selected regions. For example, the material of the printed circuit board is removed in the regions identified by reference numerals 20, 22, 23, 24 and 26. This step can be performed by punching, cutting or machining the printed circuit board to form the plurality of openings and contours shown in FIG. 1. Each of the substrate sections is attached to the remaining portions of the printed circuit board by a plurality of ribs such as those identified by reference numerals 30, 32, 34 and 36. As will be described in greater detail below, the remaining portions of the printed circuit board are used to maintain the integrity of the structure, assist in providing its rigidity and facilitate the handling of the assembly during the manufacturing processes. In other words, the portions of the printed circuit board identified by reference numerals 40, 42, 44, 46 and 48 are used during the manufacturing process to support the substrate sections and related components and, in addition, to provide rigidity for the entire structure during the manufacturing steps and assist in locating the structure relative to various machinery that is used to fabricate the plurality of proximity sensors. As shown in FIG. 1, the printed circuit board is also provided with a plurality of mounting and locating holes that are used to provide accurate positioning of the printed circuit board relative to machinery used to insert components on the substrate sections, mount a core and coil assembly and mount the connector assembly as will be described in greater detail below.

With continued reference to FIG. 1, the exploded view also shows a plurality of cores 50 that are each associated with a coil 52. The core and coil assembly 52 is attached to a first end 54 of the substrate section. The wire that is wound around the bobbin to form the coil assembly is electrically connected to the conductive pads, 56 and 58, at the first end 54 of the substrate section.

Figure 2:
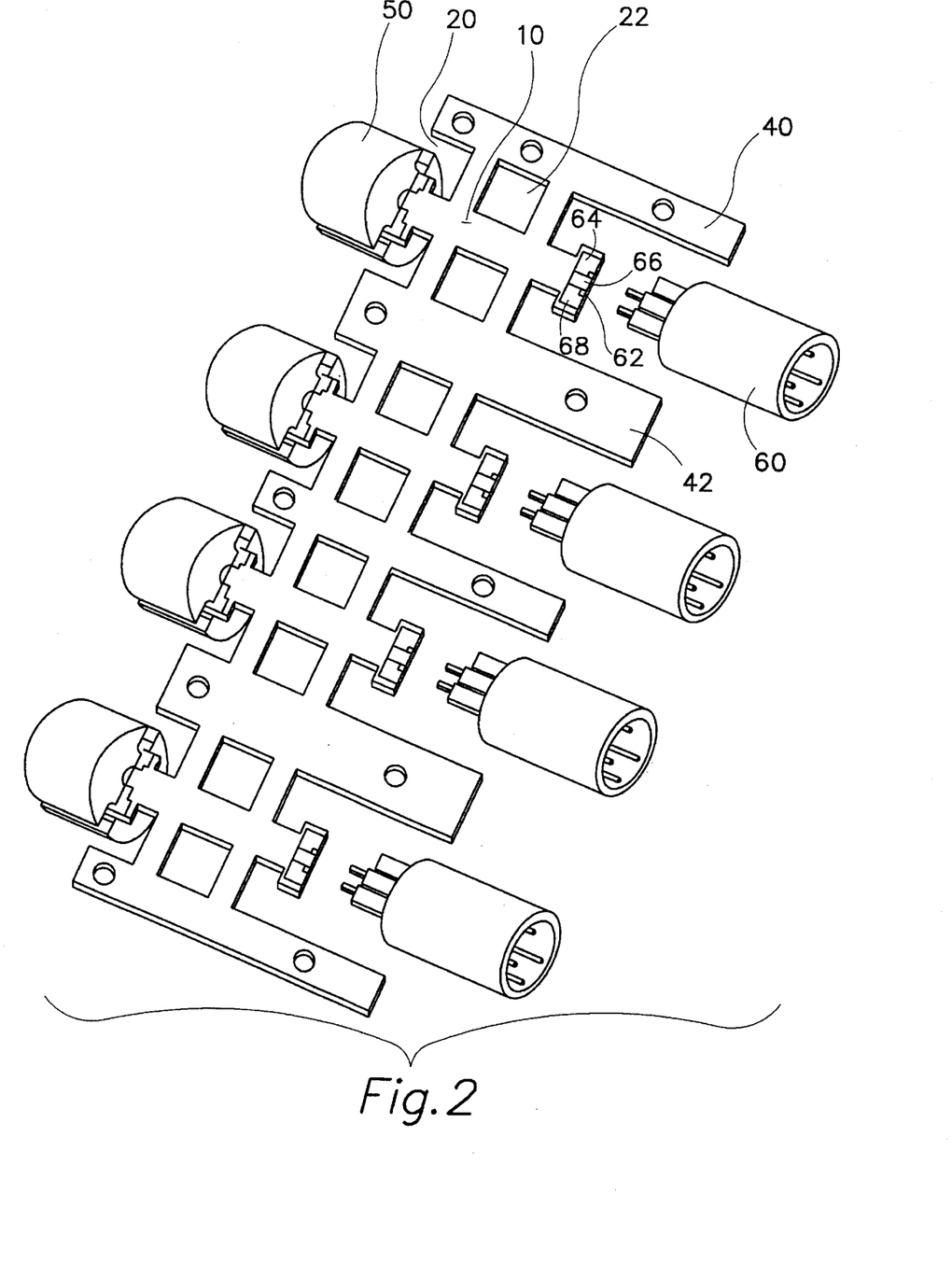
FIG. 2 shows an exploded view of a partially assembled printed circuit board and a plurality of electrical connectors.

FIG. 2 illustrates as exploded view showing the printed circuit board with the attached core 50 and coil assemblies and, in addition, a plurality of electrical connectors 60 that are disposed proximate the position where they will be attached to a second end 62 of the substrate sections 10. The second end 62 of each of the substrate sections is provided with three conductive pads, 64, 66 and 68, that are provided to permit associated conductors of the connector 60 to be electrically connected to the substrate section. Although FIG. 2 illustrates a plurality of electrical connectors 64 of a certain type, it should be understood that many different alternative connectors can be used in conjunction with the present invention. For example, a wire can be electrically connected to the second end 62 of each of the substrate sections.

Figure 3:
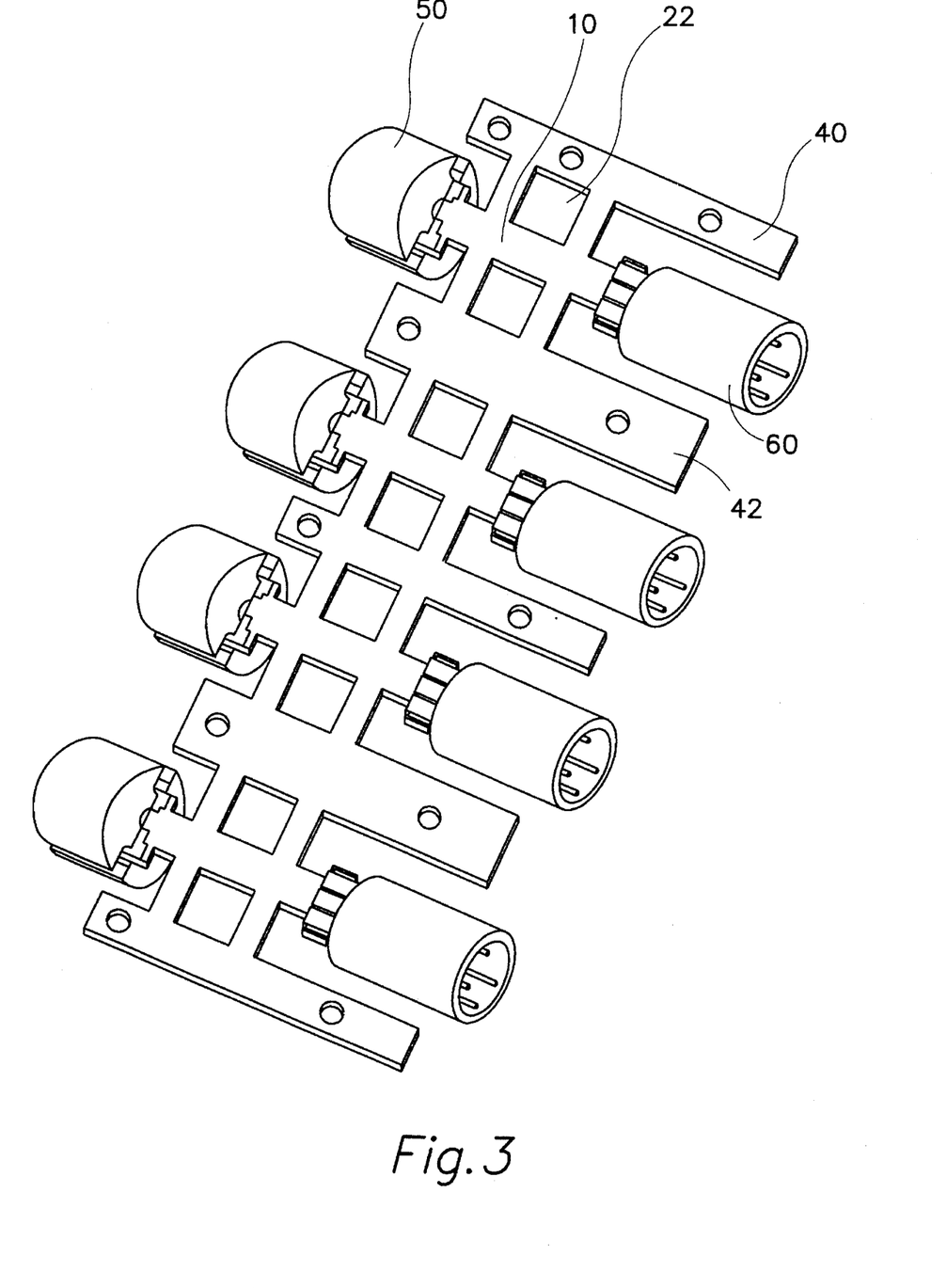
FIG. 3 shows a printed circuit board, such as that shown in FIGS. 1 and 2, with the core and coil assemblies and the connectors attached thereto.

FIG. 3 shows the printed circuit board with a core 50 and coil 52 attached to the first ends of each of the substrate sections and a connector 60 attached to the second ends of each of the substrate sections. Although not particularly shown in FIG. 3, it should be understood that each of the substrate sections has a plurality of electronic components attached to it. In other words, the conductive runs that are normally provided by a printed circuit board are associated with the components necessary to provide the detection circuit for the proximity sensor. For purposes of clarity, these components are not shown in FIGS. 1, 2 and 3. However, it should be understood that these conductive runs and associated components are disposed on at least one side of each of the substrate sections prior to the installation of the core and the coil assemblies and the connectors. In addition, it should also be realized that in a preferred embodiment of the present invention, electronic components would be attached to each of the substrate sections on both the upper side which is visible in FIGS. 1, 2 and 3, and the underside of the printed circuit board.

With continued reference to FIG. 3, the assembly of substrate sections, electronic components attached to the substrate sections, the coil and core assemblies and the connectors can be transported from station to station during the manufacturing process. After all of the electrical connections are made, the assembly shown in FIG. 3 can be tested and calibrated to make sure that each of the individual proximity sensors works properly. Any necessary calibration adjustments can be made during this testing and calibrating procedure. The rigidity of the printed circuit board facilitates the transportation of the assembly shown in FIG. 3 from one machine to another and accurately maintains the relative physical positions of all of the components that are attached to or disposed on the printed circuit board and its substrate sections.

One of the significant advantages of the present invention, which will be described in greater detail below, is that it uses a rigid printed circuit board to maintain the integrity of the assembly of substrate sections and related components during most of the stages of manufacturing of the plurality of proximity sensors. This rigidity of the printed circuit board allows all of the components to be maintained in predictable positions relative to each other during the transportion of the assembly from one machine to another. In addition, the rigidity of the printed circuit board facilitates its handling since it does not deform or sag when the bottom surface of the printed circuit board is not fully supported.

Figure 4:
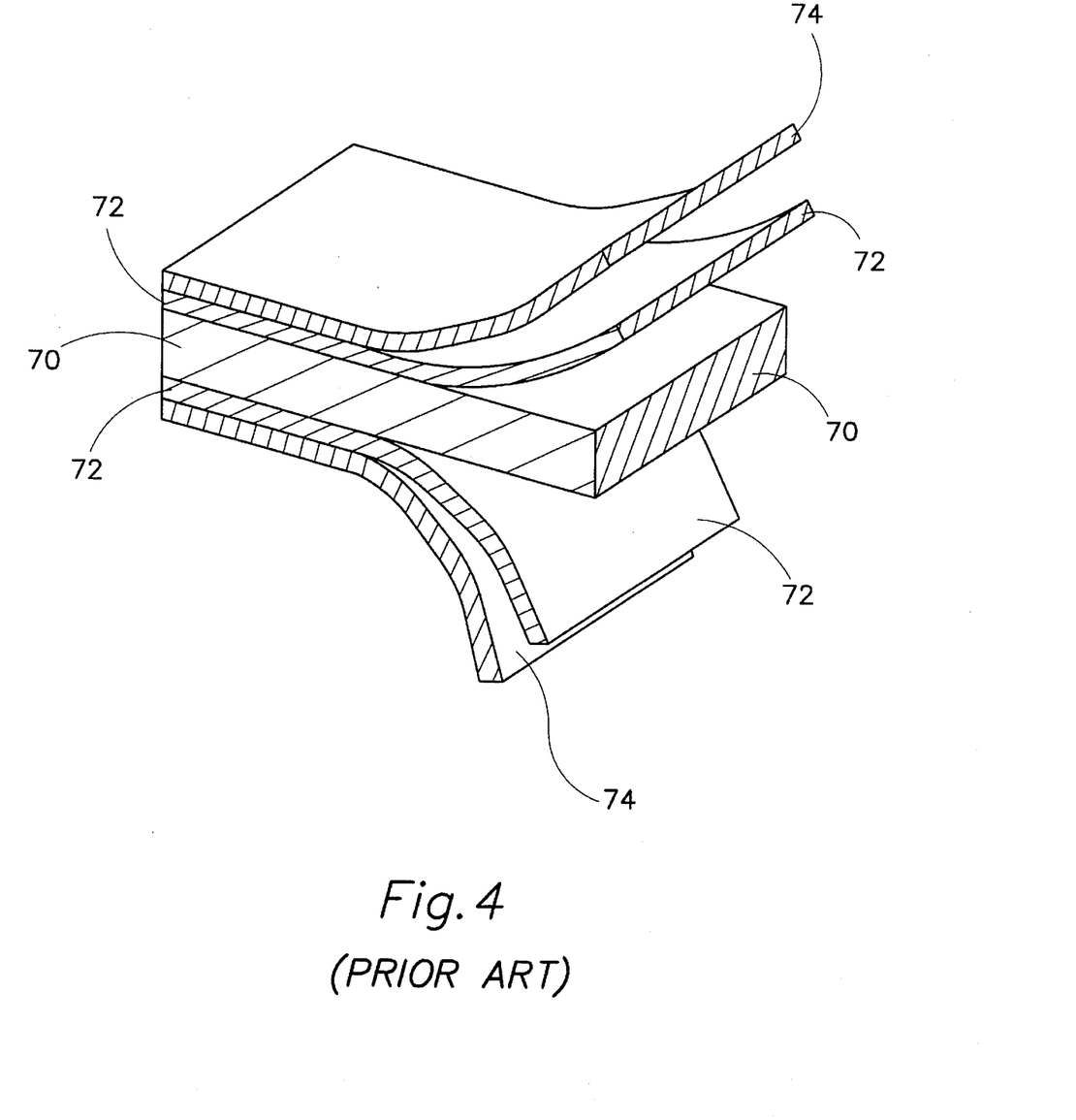
FIG. 4 is an illustration of the structure of a printed circuit board.

FIG. 4 shows a sectional view that schematically illustrates the structure of a typical printed circuit board. The central portion 70 is typically a rigid phenolic material that provides the structural rigidity of the printed circuit board. In a preferred embodiment of the present invention, a copper sheet 72 is attached to both sides of the phenolic material 70 and appropriately etched to define a plurality of conductive runs on both sides of the printed circuit board. This process is well known to those skilled in the art and is used in most printed circuit boards. As is also well known to those skilled in the art, holes can be provided through the thickness of the printed circuit board to operate as vias and allow interconnection between portions of the circuit on the first surface of the printed circuit board to portions of the circuit on the second surface of the printed circuit board. These via holes can be plated through to facilitate this interconnection. The solder masks 74 are provided to mask certain portions of the conductive runs on the copper layers 72 to prevent solder from attaching to those masked portions.

The concepts described in conjunction with FIG. 4 are known to those skilled in the art and the present invention does not rely on those specific details for its novelty. Instead, the present invention utilizes the advantages provided by printed circuit boards in an adaptation, with an encapsulation process wherein printed circuit boards have not been utilized in this way in the past. More specifically, the present invention uses a printed circuit board assembly, such as those illustrated in FIGS. 1, 2 and 3, which is sheared apart as will be described in greater detail below to provide a plurality of proximity sensors. In addition, the present invention utilizes a printed circuit board in an application of overmolding a plurality of encapsulations in a single process prior to shearing the plurality of encapsulations apart and separating them from the printed circuit board. These advantages can be achieved by the present invention because of the rigidity of the phenolic material 70 and those same advantages could not readily be realized if a flexible circuit was used in combination with the other steps of the present invention. The lack of rigidity of the flexible circuit material would result in the significantly more difficult handling of the assembly.

Figure 5:
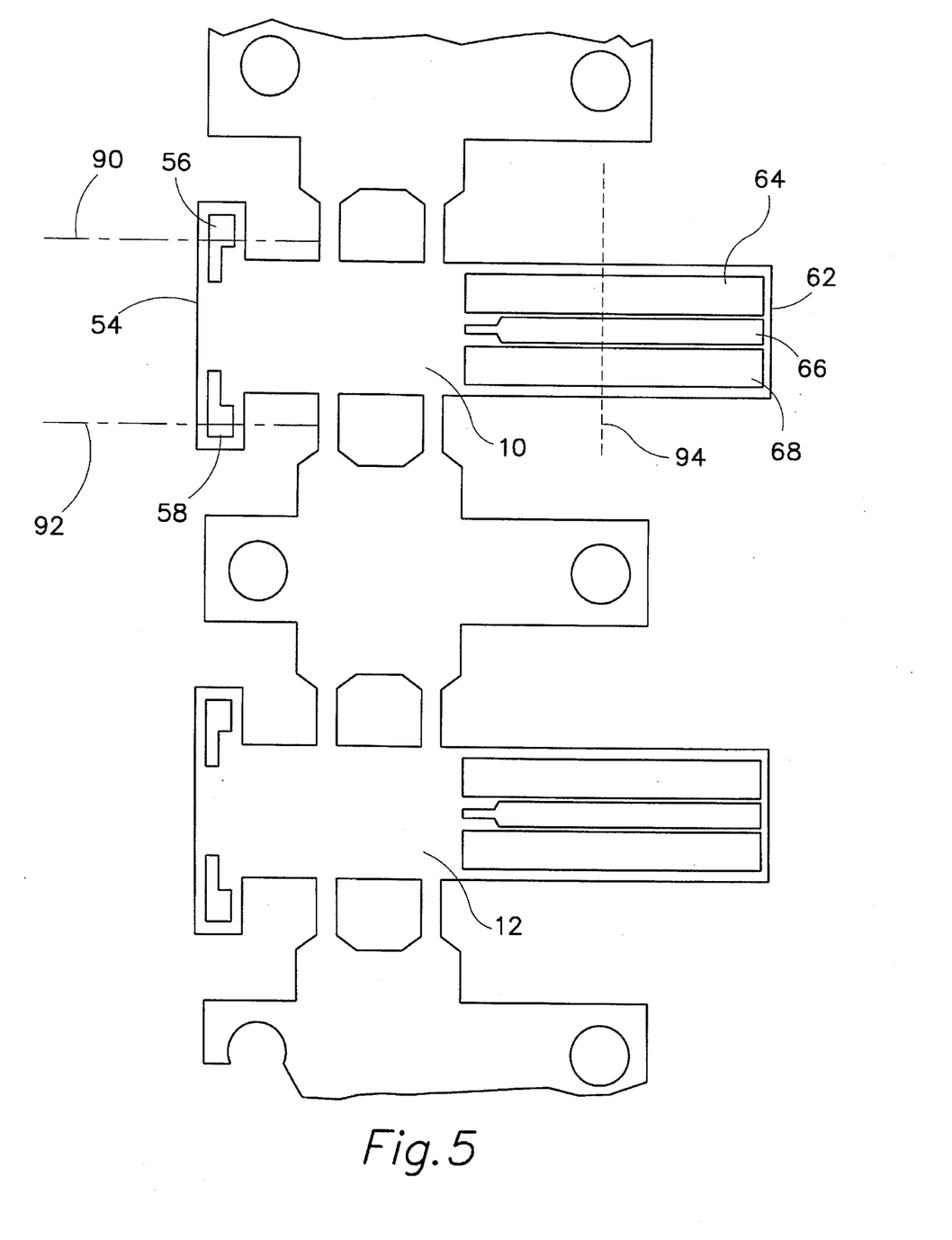
FIG. 5 shows the way in which the substrate sections of the present invention can be sheared to accommodate many different sizes of components.

FIG. 5 is a view of the printed circuit board after it has been perforated to define the plurality of substrate sections. The purpose of FIG. 5 is to illustrate one of the advantages of the present invention. Each of the substrate sections can be selectively trimmed to conform to the desired dimensions of the proximity sensor being manufactured. Because of this capability, a single style of printed circuit board can be used to manufacture many different styles of proximity sensors. The length and width of the individual substrate sections can be made oversized so that they can be trimmed to suit any one of many different dimensional requirements. To illustrate this, lines 90 and 92 show where the first end 54 of the substrate section can be trimmed. By shearing the printed circuit board material at lines 90 and 92, the overall effective width of the first end 54 can be reduced. The shape and size of the conductive portions, 56 and 58, are made so that this shearing along lines 90 and 92 will leave sufficient conductive pad material at the first end 54 for the coil and core assembly to be appropriately attached and electrically connected. The second end 62 of the substrate section can also be sheared along line 94 to reduce the overall length of the substrate section. This allows shorter proximity sensors to be manufactured from the same style of printed circuit boards from which longer proximity sensors are manufactured. By configuring the dimensions of the substrate sections to that of the largest desired proximity sensor and core, the shearing step can be used to preselect the appropriate dimensions for smaller proximity sensors.

Figure 6:
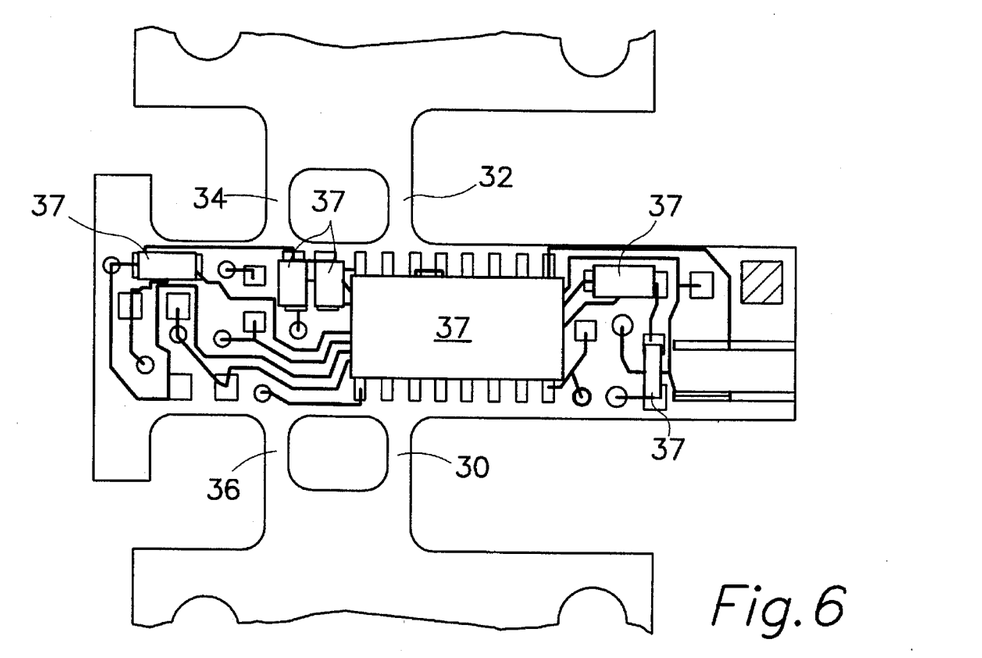
FIGS. 6 and 7 show the first and second sides of a typical substrate section and illustrate where conductive runs and components could be attached to its surfaces.
Figure 7:
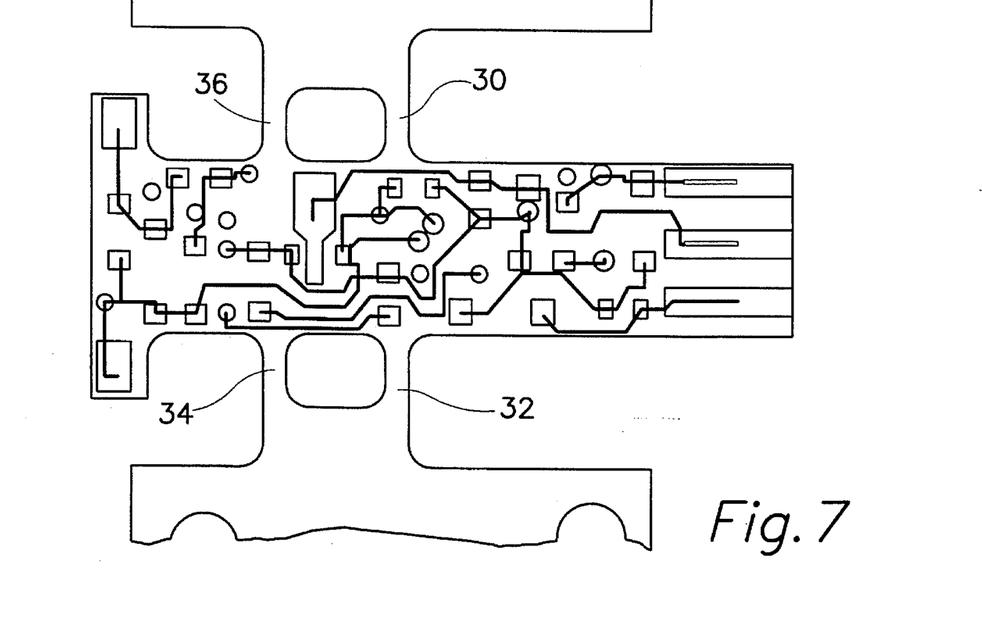

FIGS. 6 and 7 show the first and second sides of the substrate sections with the appropriate component locations identified. It should be understood that FIGS. 6 and 7 are exemplary in nature and do not limit the present invention in relation to the particular configuration of the conductive runs or the component locations. Furthermore, the precise shape and location of the conductive pads in FIGS. 6 and 7 are exemplary in nature. The purpose of FIGS. 6 and 7 is to show that both sides of the substrate sections can be used to carry a plurality of electronic components 37 for the purpose of providing the required electronic circuit necessary to perform the analysis of the waveforms used by a proximity sensor to determine the presence or absence of a conductive element within the detection zone of the sensor. Shown in conjunction with the substrate sections in FIGS. 6 and 7 are the ribs that connect the substrate section to the other portions of the printed circuit board.

The structure illustrated in FIG. 3 can be disposed within an overmolding machine by rigidly supporting the components related to each of the proximity sensors within a particular cavity of an overmolding machine. The holes shown extending through the thickness of the printed circuit board in FIGS. 1, 2 and 3 can serve as locating devices that accurately position the core and coil assembly, the electronic components, the electrical connector and the portions of the substrate sections at precise locations within the mold of the overmolding machine.

Figure 8:
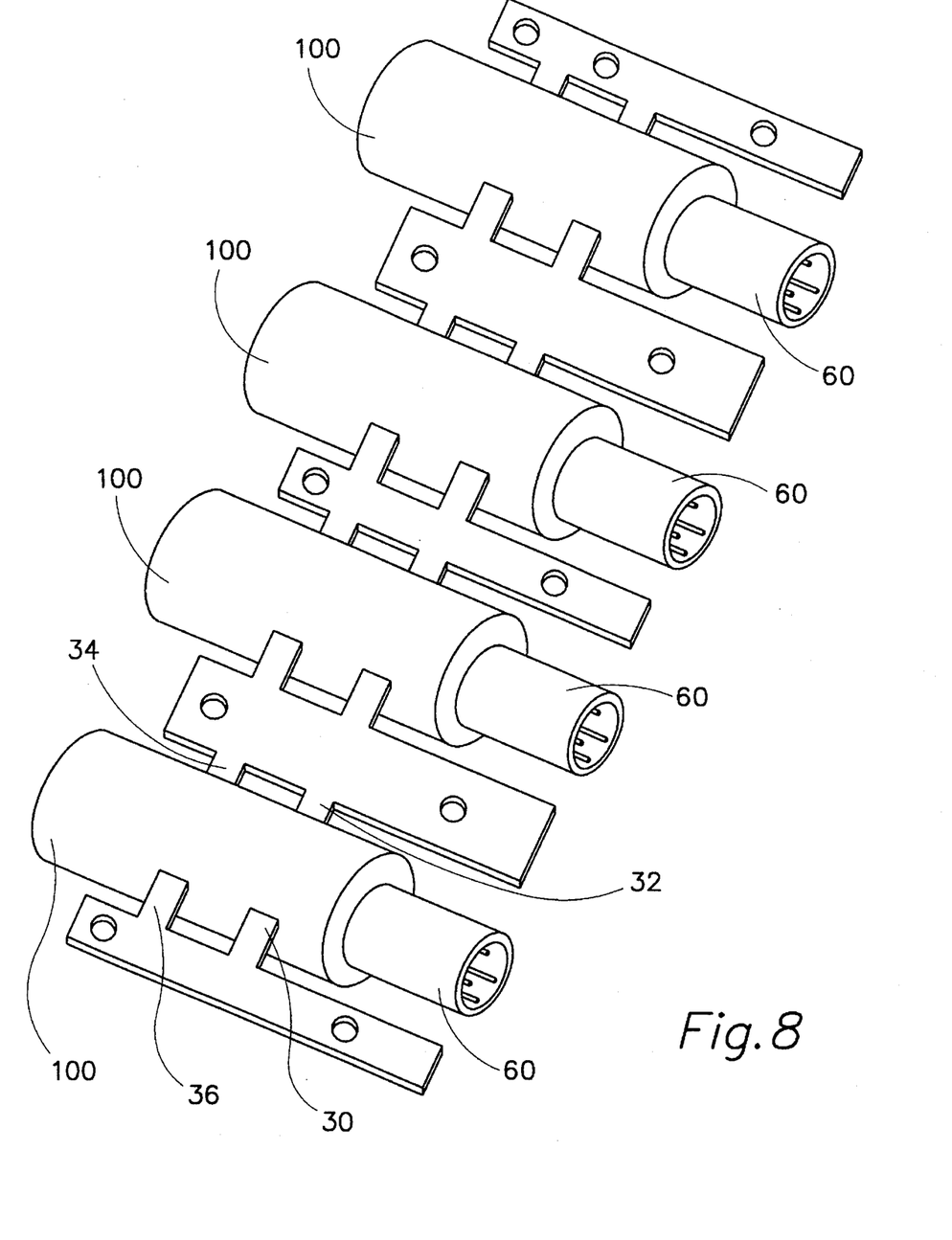
FIG. 8 shows a plurality of encapsulations formed by an overmolding machine and attached to the printed circuit board.

FIG. 8 shows the results of the overmolding process which simultaneously forms a plurality of encapsulations disposed around each of the groups of components associated with the particular substrate sections illustrated in FIG. 3. In a particularly preferred embodiment of the present invention, the encapsulations comprise a thermoset material, such as that which is identified as part number NB2628-31A which is available in commercial quantities from the Dexter Hysol Company. Although a thermoplastic material could alternatively be used in this manner, it has been found that the use of thermoset material facilitates the procedure significantly. In FIG. 8, the plurality of encapsulations 100 are generally cylindrical in shape and each of the encapsulations 100 has a connector 60 extending from the second end of the substrate section that is contained within the encapsulation. Through the continued use of the printed circuit board as a handling apparatus, the plurality of encapsulations 100 can be removed from the overmolding machine and taken to another work station for continued processing.

Figure 9:
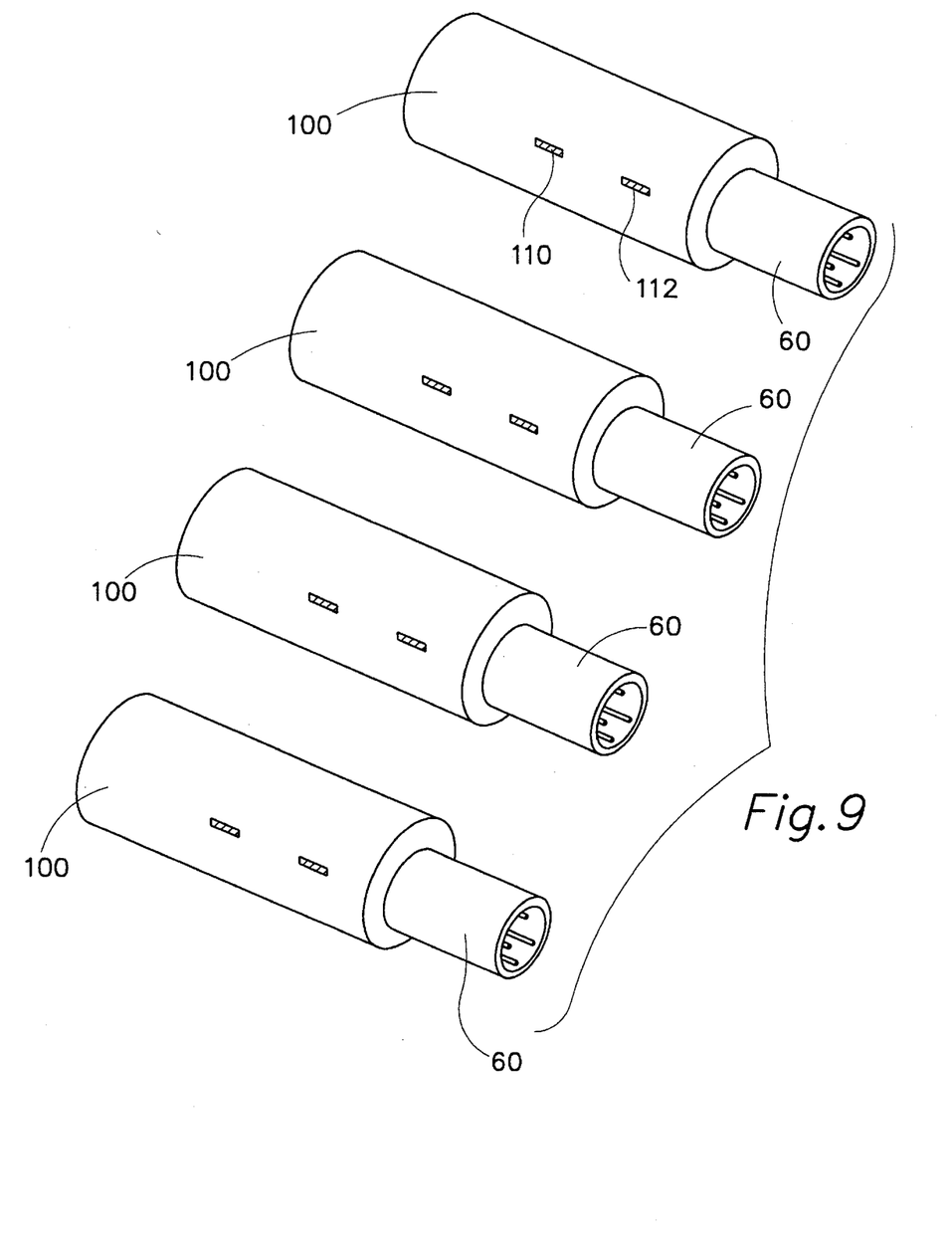
FIG. 9 shows a plurality of encapsulations after they are severed from the printed circuit board by a shearing step.

FIG. 9 shows the plurality of encapsulations 100 after they are sheared apart from the printed circuit board. This process is accomplished by shearing the ribs, such as those identified by reference numerals 30, 32, 34 and 36 in FIG. 8, and discarding the remaining portions of the printed circuit board other than those portions that have been enclosed within the encapsulations 100. In FIG. 9, reference numerals 110 and 120 are used to identify the locations where the sheared ribs extend to the outer cylindrical surface of the encapsulations 100. The devices shown in FIG. 9 are proximity sensors that can be attached to an appropriate electrical connector and used to detect the presence of an electrically conductive element within their detection zone.

Figure 10:
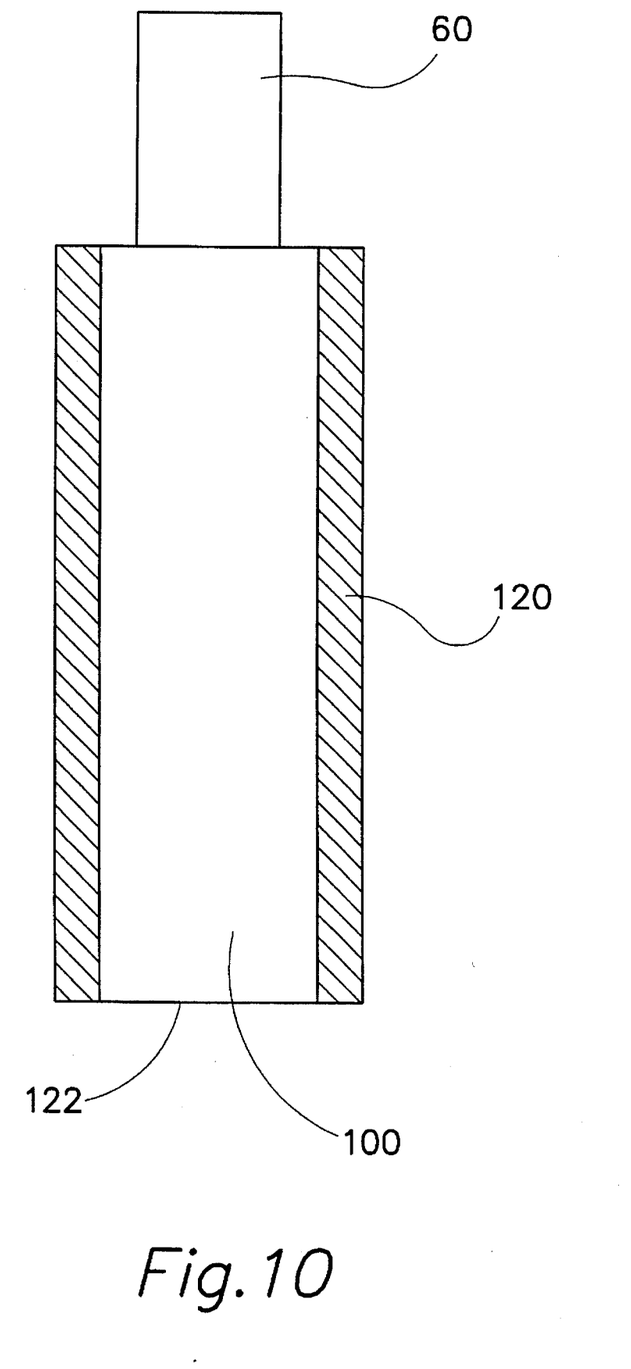
FIG. 10 is a sectional view of an encapsulation inserted within a cylindrical housing.

FIG. 10 illustrates an additional manufacturing step wherein the encapsulation 100 is disposed within a tubular housing 120. The face 122 of the encapsulation 100 is exposed at one end of the tubular housing structure 120 and the connector 60 extends from the other end. Although it should be understood that the encapsulation 100 could alternatively be disposed within a housing that comprises an end portion, it has been found that the elimination of the end portion allows the face 122 of the proximity sensor to be disposed more closely to the region where an electrically conductive element will pass. The housing structure 120 can be plastic or metal. If the housing structure 120 is metallic, it is typically made of nickel plated brass or stainless steel.

Figure 11:
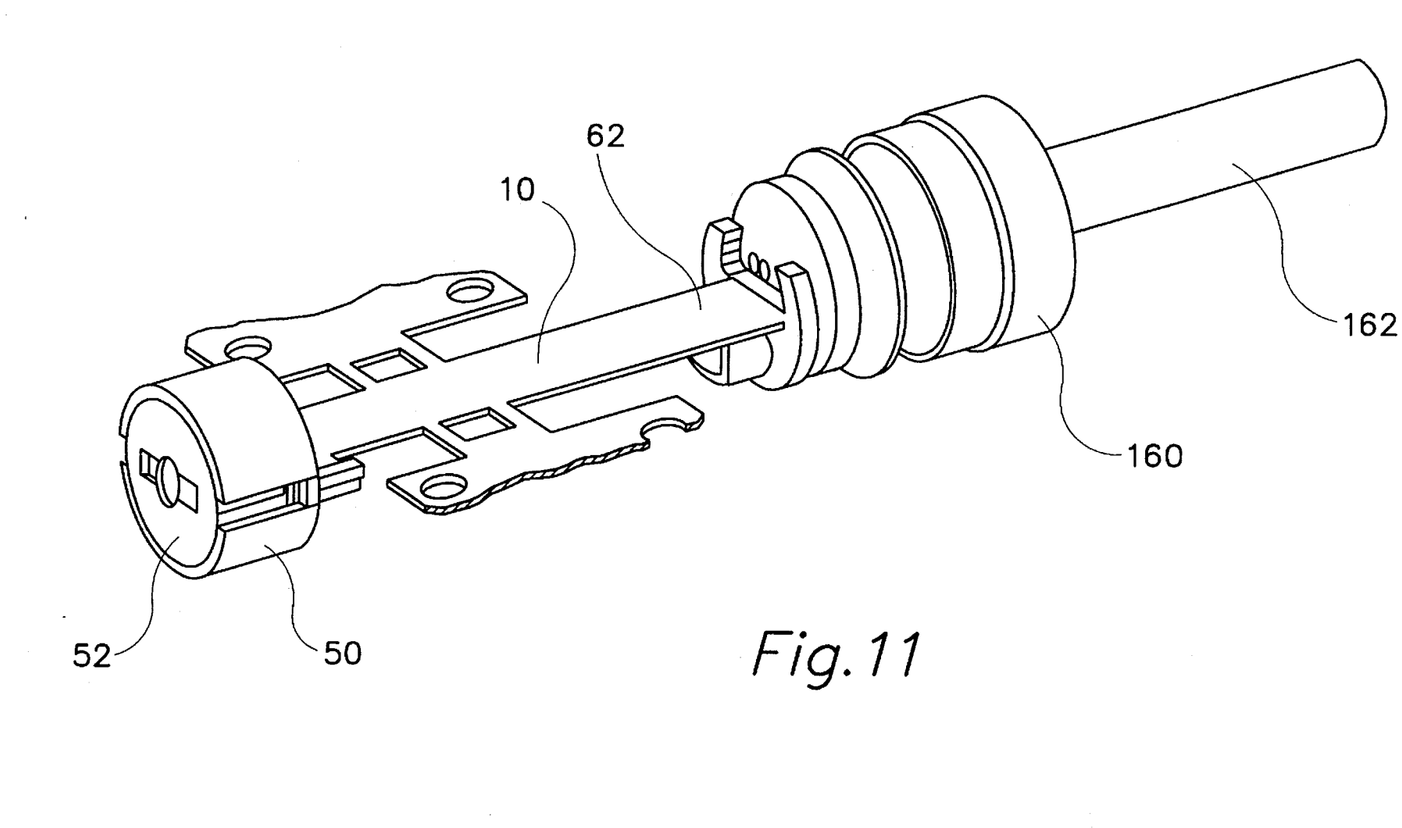
FIG. 11 is an illustration of an alternative embodiment of the present invention.

FIG. 11 shows an alternative arrangement of the present invention wherein a connector 160 is provided with a conductor 162 that is attached to it. In this manner, the processes described above would yield a proximity sensor with the conductor 162 extending from it instead of the pin connector 60 as described above. All of the other processes of the present invention are the same, regardless of whether a connector 60 such as that described above or the connector 160 is used.

The present invention provides a process for manufacturing proximity sensors in a way which it is significantly more efficient than the methods known to those skilled in the art. It accomplishes this improvement in efficient manufacturing by incorporating a printed circuit board that is rigid. The rigidity of the printed circuit board allows automated manufacturing techniques to be used to assemble, calibrate and mold the components. The processes used to manufacture the proximity sensors according to the present invention result in a plurality of proximity sensors being processed during each of the steps of the present invention. The rigidity of the printed circuit board facilitates this grouping of proximity sensors during each step of the process.

Although the present invention has been described with significant specificity and illustrated to show a particularly preferred embodiment of the present invention, it should be understood that alternative embodiments are also within its scope.

The embodiments of the invention in which an exclusive property or right is claimed are defined as follows:

1. A method for manufacturing a proximity sensor, comprising:

providing a printed circuit board having a first side and a second side;

perforating said printed circuit board to form a plurality of substrate sections connected together by a plurality of ribs, each of said plurality of substrate sections having a first plurality of electrically conductive paths formed thereon;

attaching a first plurality of electronic components to said first side of each of said plurality of substrate sections, each of said first plurality of electronic components being connected in electrical communication with at least one of said first plurality of electrically conductive paths of a preselected one of said plurality substrate sections to form a first electrical circuit on each of said plurality of substrate sections;

attaching an electrical coil to a first end of each of said plurality of substrate sections;

attaching an electrical connector to a second end of each of said plurality of substrate sections;

calibrating each of said first electrical circuits;

simultaneously forming a plurality of encapsulations, each of said plurality of encapsulations being disposed around one of said plurality of substrate sections and its associated electronic components, coil and connector; and severing said ribs to detach each of said plurality of encapsulations from said printed circuit board.

2. The method of claim 1, further comprising:

attaching a second plurality of electronic components to said second side of each of said plurality of substrate sections, each of said second plurality of electronic components being connected in electrical communication with at least one of a second plurality of electrically conductive paths on said second side of a preselected one of said plurality of substrate sections to form a second electrical circuit on each of said plurality of substrate sections.

3. The method of claim 1, further comprising:

shearing said first end of each of said plurality of substrate sections to accommodate a preselected size of said coil.

4. The method of claim 1, wherein:

each of said coils is wound around an associated core structure.

5. The method of claim 1, further comprising:

shearing said second end of each of said plurality of substrate sections to select an effective length of said proximity sensor.

6. The method of claim 1, further comprising:

inserting each of said plurality of encapsulations into a tubular housing.

7. The method of claim 6, wherein:

said tubular housing is made of metal.

8. The method of claim 6, further comprising:

placing an O-ring around each of said plurality of encapsulations prior to performing said inserting step.

9. The method of claim 1, wherein:

each of said plurality of encapsulations comprises a thermoset material.

10. A method for manufacturing a proximity sensor, comprising:

providing a printed circuit board having a first side and a second side;

perforating said printed circuit board to form a plurality of substrate sections connected together by a plurality of ribs, each of said plurality of substrate sections having a first plurality of electrically conductive paths formed thereon;

attaching a first plurality of electronic components to said first side of each of said plurality of substrate sections, each of said first plurality of electronic components being connected in electrical communication with at least one of said first plurality of electrically conductive paths of a preselected one of said plurality substrate sections to form a first electrical circuit on each of said plurality of substrate sections;

attaching an electrical coil to a first end of each of said plurality of substrate sections;

attaching an electrical connector to a second end of each of said plurality of substrate sections;

calibrating each of said first electrical circuits;

simultaneously forming a plurality of encapsulations, each of said plurality of encapsulations being disposed around one of said plurality of substrate sections and its associated electronic components, coil and connector;

severing said ribs to detach each of said plurality of encapsulations from said printed circuit board; and attaching a second plurality of electronic components to said second side of each of said plurality of substrate sections, each of said second plurality of electronic components being connected in electrical communication with at least one of a second plurality of electrically conductive paths on said second side of a preselected one of said plurality substrate sections to form a second electrical circuit on each of said plurality of substrate sections.

11. The method of claim 10, further comprising:

shearing said first end of each of said plurality of substrate sections to accommodate a preselected size of said coil.

12. The method of claim 10, wherein:

each of said coils is wound around an associated core structure.

13. The method of claim 10, further comprising:

shearing said second end of each of said plurality of substrate sections to select an effective length of said proximity sensor.

14. The method of claim 10, further comprising:

inserting each of said plurality of encapsulations into a tubular housing; and placing an O-ring around each of said plurality of encapsulations prior to performing said inserting step.

15. The method of claim 14, wherein:

said tubular housing is made of metal.

16. The method of claim 10, wherein:

each of said plurality of encapsulations comprises a thermoset material.

17. A method for manufacturing a proximity sensor, comprising:

providing a printed circuit board having a first side and a second side;

perforating said printed circuit board to form a plurality of substrate sections connected together by a plurality of ribs, each of said plurality of substrate sections having a plurality of electrically conductive paths formed thereon;

attaching a first plurality of electronic components to said first side of each of said plurality of substrate sections, each of said first plurality of electronic components being connected in electrical communication with at least one of said first plurality of electrically conductive paths of a preselected one of said plurality substrate sections to form a first electrical circuit on each of said plurality of substrate sections;

attaching an electrical coil to a first end of each of said plurality of substrate sections, each of said coils being wound around an associated core structure;

attaching an electrical connector to a second end of each of said plurality of substrate sections;

calibrating each of said first electrical circuits;

simultaneously forming a plurality of encapsulations, each of said plurality of encapsulations comprising a thermoset material, each of said plurality of encapsulations being disposed around one of said plurality of substrate sections and its associated electronic components, coil and connector;

severing said ribs to detach each of said plurality of encapsulations from said printed circuit board;

attaching a second plurality of electronic components to said second side of each of said plurality of substrate sections, each of said second plurality of electronic components being connected in electrical communication with at least one of a second plurality of electrically conductive paths on said second side of a preselected one of said plurality substrate sections to form a second electrical circuit on each of said plurality of substrate sections;

shearing said first end of each of said plurality of substrate sections to accommodate a preselected size of said coil;

shearing said second end of each of said plurality of substrate sections to select an effective length of said proximity sensor;

inserting each of said plurality of encapsulations into a tubular housing; and placing an O-ring around each of said plurality of encapsulations prior to performing said inserting step.

\* \* \* \* \*